(12) United States Patent
Peng et al.

(10) Patent No.: US 11,996,363 B2
(45) Date of Patent: May 28, 2024

(54) INTERCONNECT STRUCTURE INCLUDING A HEAT DISSIPATION LAYER AND METHODS OF FORMING THE SAME

(71) Applicant: TAIWAN SEMICONDUCTOR MANUFACTURING COMPANY, LTD., Hsinchu (TW)

(72) Inventors: Yu-Yun Peng, Hsinchu (TW); Keng-Chu Lin, Ping-Tung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 271 days.

(21) Appl. No.: 17/473,573

(22) Filed: Sep. 13, 2021

(65) Prior Publication Data
US 2022/0352073 A1    Nov. 3, 2022

Related U.S. Application Data

(60) Provisional application No. 63/180,901, filed on Apr. 28, 2021.

(51) Int. Cl.
*H01L 23/535* (2006.01)
*H01L 21/768* (2006.01)
*H01L 23/373* (2006.01)
*H01L 23/528* (2006.01)
*H01L 23/532* (2006.01)

(52) U.S. Cl.
CPC ...... *H01L 23/535* (2013.01); *H01L 21/76805* (2013.01); *H01L 21/76895* (2013.01); *H01L 23/3736* (2013.01); *H01L 23/5283* (2013.01); *H01L 23/53228* (2013.01)

(58) Field of Classification Search
CPC ............ H01L 23/535; H01L 23/3736; H01L 23/5283; H01L 23/53228; H01L 23/36; H01L 23/53295; H01L 23/522; H01L 21/76805; H01L 21/76895; H01L 21/76832; H01L 21/76802; H01L 21/76829; H01L 21/76877
See application file for complete search history.

(56) References Cited

U.S. PATENT DOCUMENTS

| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |

(Continued)

*Primary Examiner* — Shahed Ahmed
*Assistant Examiner* — Vicki B. Booker
(74) *Attorney, Agent, or Firm* — NZ CARR LAW OFFICE

(57) ABSTRACT

An interconnect structure, along with methods of forming such, are described. In some embodiments, the structure includes a first dielectric layer disposed over one or more devices, a first conductive feature disposed in the first dielectric layer, a second dielectric layer disposed over the first dielectric layer and the first conductive feature, and a second conductive feature disposed in the second dielectric layer. The second conductive feature is electrically connected to the first conductive feature. The structure further includes a heat dissipation layer disposed between the first and second dielectric layers, and the heat dissipation layer partially surrounds the second conductive feature and is electrically isolated from the first and second conductive features.

20 Claims, 16 Drawing Sheets

(56) References Cited

U.S. PATENT DOCUMENTS

| | | |
|---|---|---|
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2007/0132059 A1* | 6/2007 | Tsai .................. H01L 23/5258 |
| | | 257/E23.15 |
| 2019/0164886 A1* | 5/2019 | Chen ................. H01L 23/5226 |
| 2021/0407991 A1* | 12/2021 | Or-Bach ............ H01L 27/0688 |

* cited by examiner

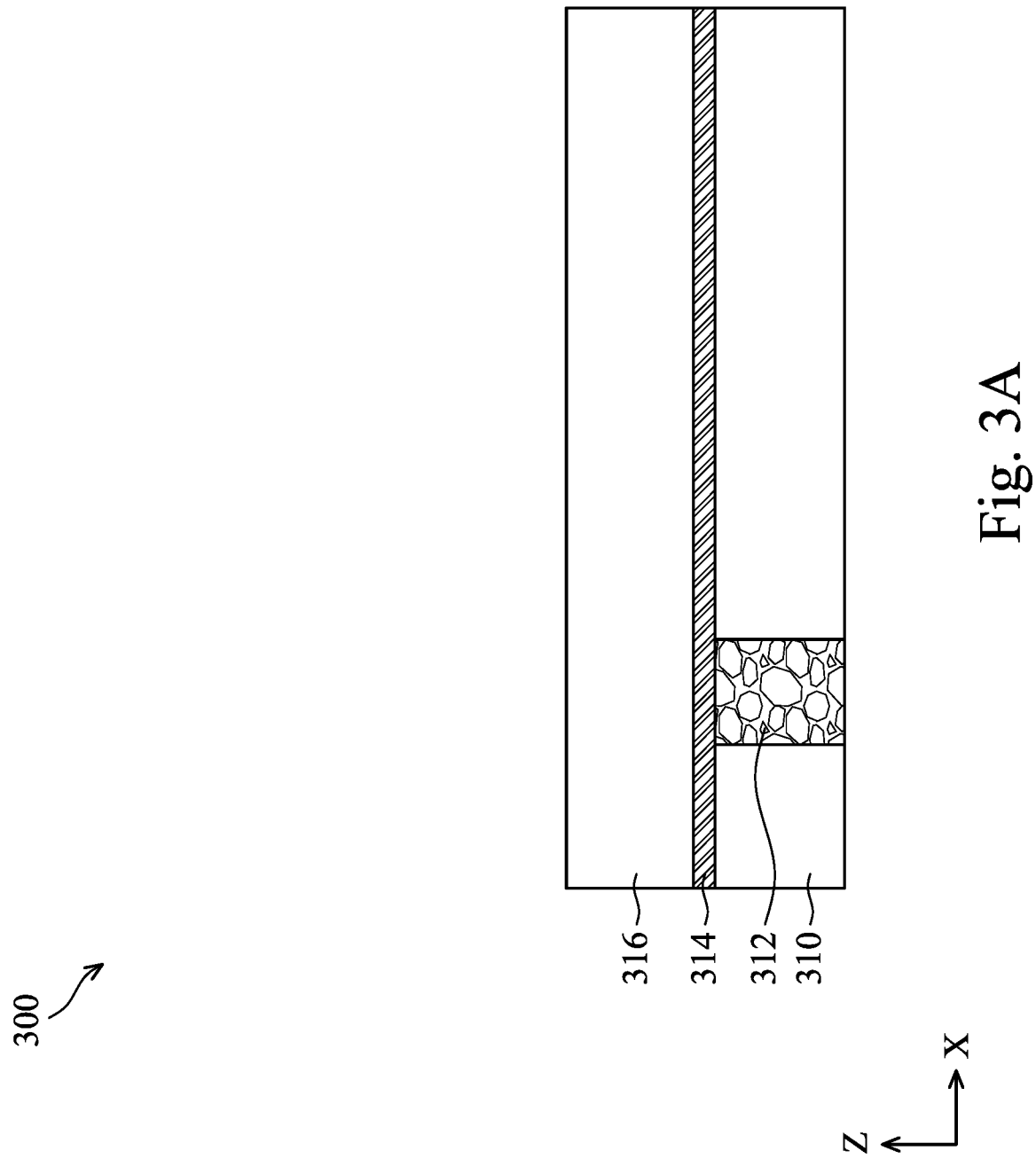

INTERCONNECT STRUCTURE INCLUDING A HEAT DISSIPATION LAYER AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, as the dimensions of the devices get smaller, device performance and reliability may be negatively impacted by localized heating. Therefore, an improved interconnect structure and methods of forming the same are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3K are cross-sectional side views of various stages of manufacturing an interconnect structure, in accordance with some embodiments.

DETAILED DESCRIPTION

Figure 1A:
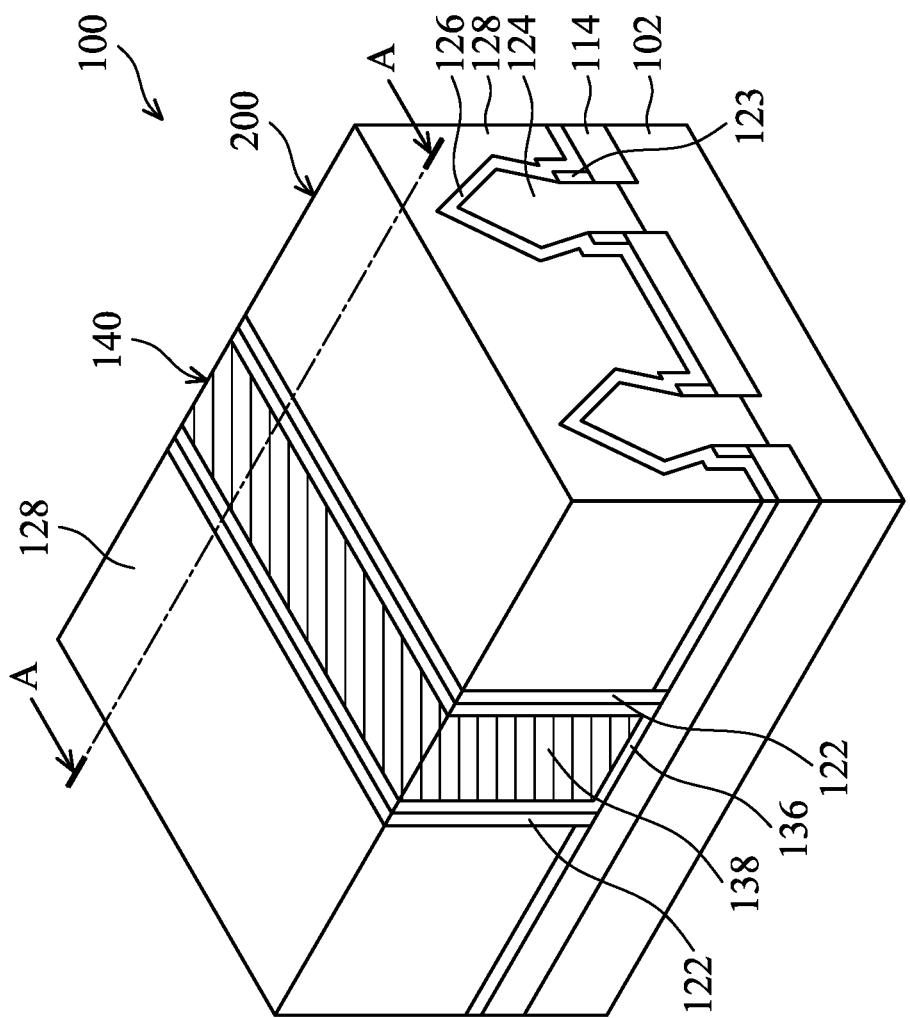
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
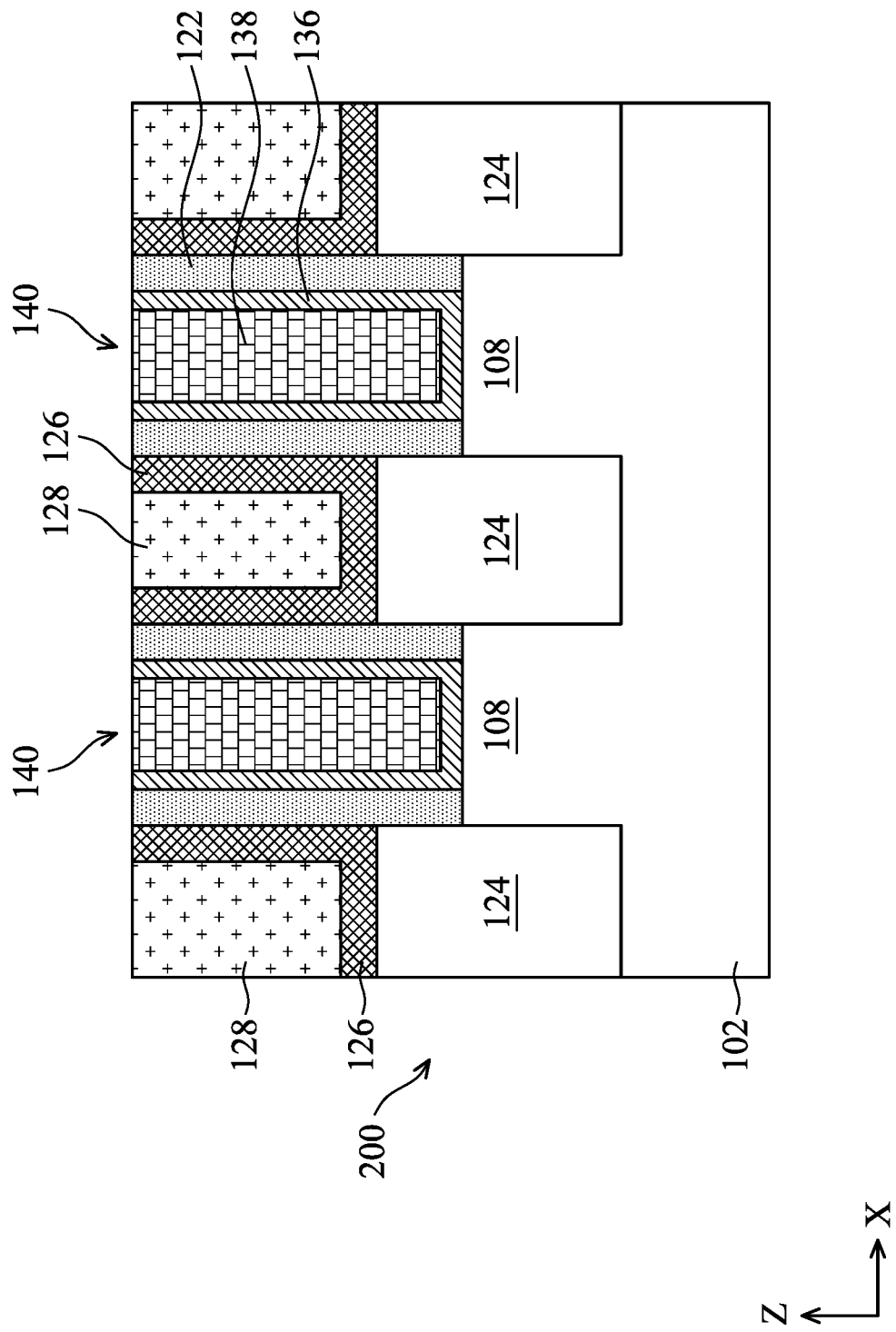
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. As shown in FIG. 1B, two gate stacks 140 are formed on the substrate 102. In some embodiments, more than two gate stacks 140 are formed on the substrate 102. Channel regions 108 are formed between S/D regions 124 serving as source regions and S/D regions 124 serving as drain regions.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 102. In some embodiments, the devices 200 are FinFETs, and the channel regions 108 are a plurality of fins disposed below the gate stacks 140. In some embodiments, the devices 200 are nanostructure transistors, and the channel regions 108 are surrounded by the gate stacks 140.

As shown in FIGS. 1A and 1B, each gate stack 140 includes a gate electrode layer 138 disposed over the channel region 108 (or surrounding the channel region 108 for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 140 may further include a gate dielectric layer 136 disposed over the channel region 108. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layers 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique.

As shown in FIG. 1A, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

As shown in FIGS. 1A and 1B, a contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

A conductive contact (not shown) may be disposed in the ILD layer 128 and over the S/D region 124. The conductive contact may be electrically conductive and include a material having one or more of Ru, Mo, Co, Ni, W, Ti, Ta, Cu, Al, TiN or TaN, and the conductive contact may be formed by any suitable method, such as electro-chemical plating (ECP), or PVD. A silicide layer (not shown) may be disposed between the conductive contact and the S/D region 124.

Figure 2:
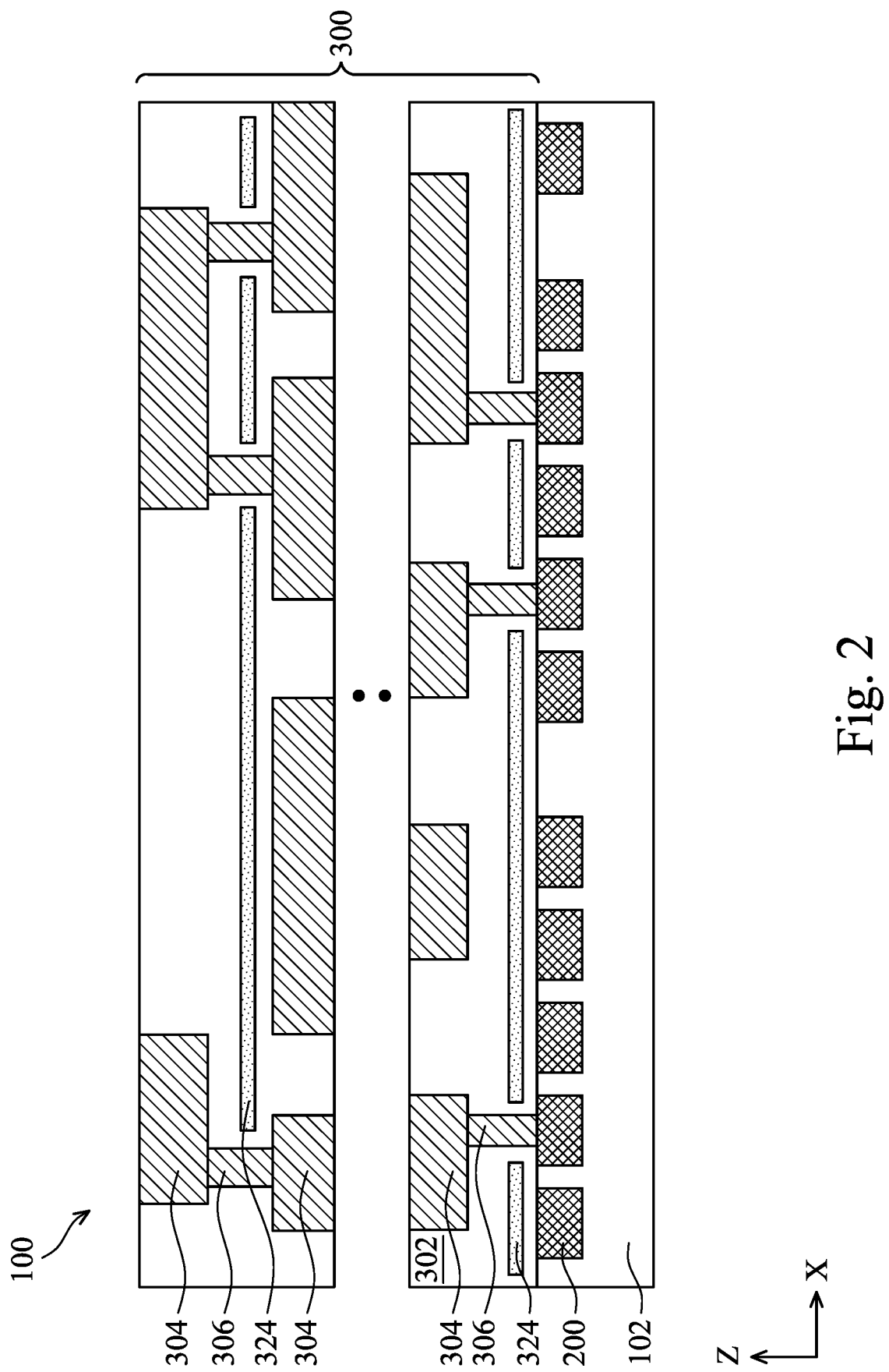
FIG. 2 is a cross-sectional side view of a stage of manufacturing the semiconductor device structure, in accordance with some embodiments.

The semiconductor device structure 100 may further includes an interconnection structure 300 disposed over the devices 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. Etch stop layers may be omitted for clarity. The etch stop layers are described in detail in FIGS. 3A-3K. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottom-most conductive features 306 of the interconnection structure 300 may be electrically connected to the conductive contacts disposed over the S/D regions 124 (FIG. 1B) and the gate electrode layer 138 (FIG. 1B). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a dielectric material having a k value ranging from about 1 to about 5.

In some embodiments, one or more heat dissipation layers 324 are disposed in the interconnect structure 300 to reduce localized heating. The IMD layer 302 includes a material that is low in thermal conductivity, such as less than 1 W/m-K. Thus, heat generated by the devices 200 is spreading via the conductive features 304, 306, which include a material having substantially greater thermal conductivity compared to that of the IMD layer 302. In some embodiments, the conductive features 304, 306 include copper, which has thermal conductivity of greater than 350 W/m-K. As the dimensions of the conductive features 304, 306 get smaller, localized heating may occur in at least some of the conductive features 304, 306. The localized heating of the conductive features 304, 306 may lead to reduced electromigration lifetime of the conductive features 304, 306. The heat dissipation layers 324 are utilized in the interconnect structure 300 to help disperse the heat in the interconnect structure 300 to prevent localized heating of the conductive features 304, 306. The heat dissipation layers 324 are described in detail in FIGS. 3A-3K.

Figure 3B:
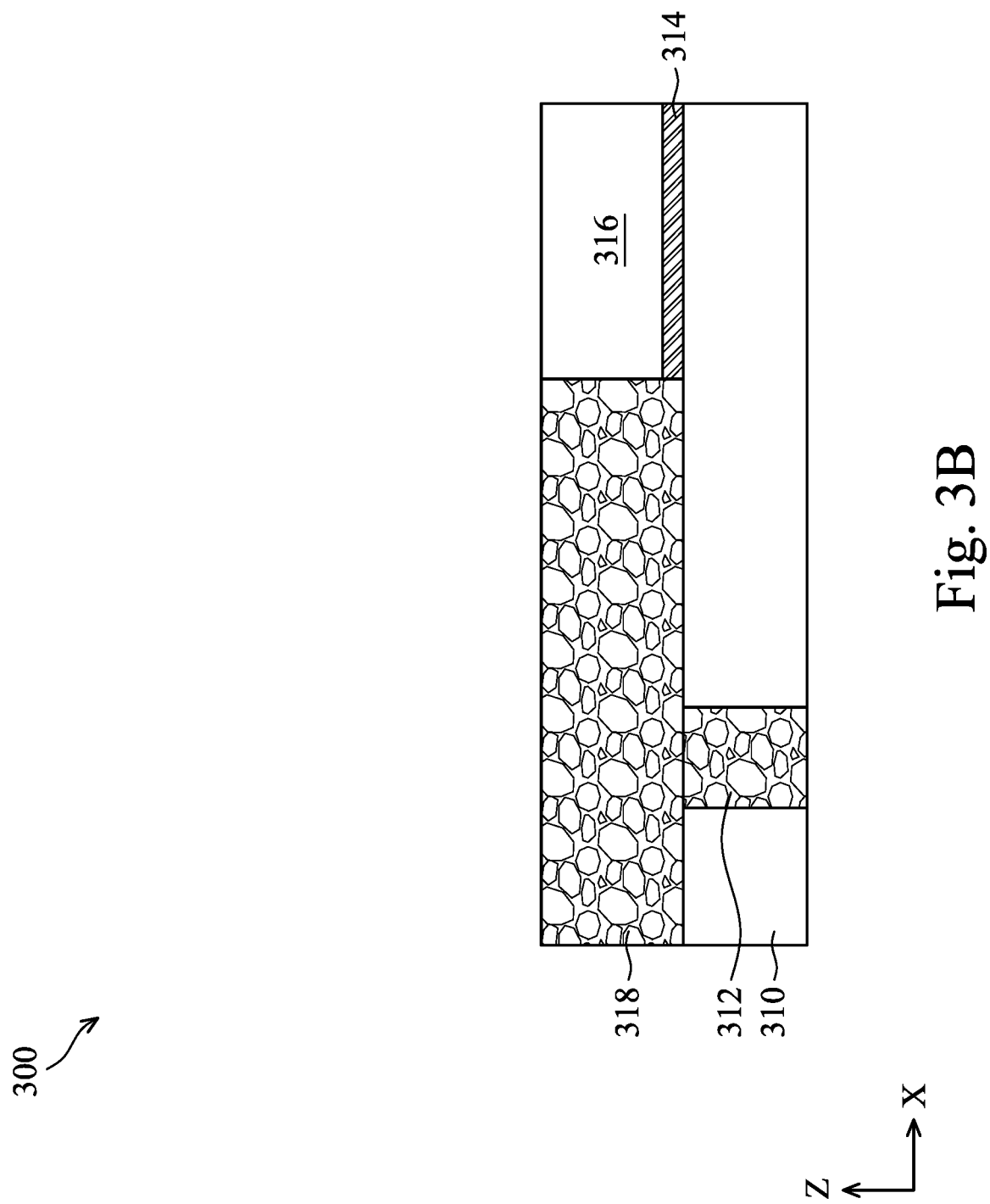

FIGS. 3A-3K are cross-sectional side views of various stages of manufacturing the interconnect structure 300, in accordance with some embodiments. As shown in FIG. 3A, the interconnect structure 300 includes a dielectric layer 310, which may be an ILD layer or an IMD layer. For example, the dielectric layer 310 may be the ILD layer 128 (FIGS. 1A and 1B) or the IMD layer 302 (FIG. 2). The dielectric layer 310 may include the same material as the ILD layer 128 or the IMD layer 302. In some embodiments, the dielectric layer 310 includes a low-k dielectric material, such as SiOCH. The dielectric layer 310 may be formed by CVD, FCVD, ALD, spin coating, or other suitable process. The dielectric layer 310 includes one or more conductive features 312 (only one is shown) disposed in the dielectric layer 310. The conductive feature 312 may include an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive feature 303 includes a metal. The conductive feature 303 may be formed by PVD, CVD, ALD, or other suitable process. In some embodiments, the conductive feature 303 may be the conductive contact disposed in the ILD layer 128 or the conductive feature 304 or 306 disposed in the IMD layer 302. In some embodiments, the conductive feature 312 includes a barrier layer (not shown) disposed between the dielectric layer 310 and the electrically conductive material of the conductive feature 312. The barrier layer may include an electrically conductive material, such as a metal or metal nitride.

A etch stop layer 314 is disposed on the dielectric layer 310. The etch stop layer 314 may include a nitrogen-containing material or an oxygen-containing material. For example, the etch stop layer 314 may be a nitride or an oxide, such as silicon nitride, a metal nitride, silicon oxide, or a metal oxide. In some embodiments, the etch stop layer 314 includes the same material as the CESL 126 (FIGS. 1A and 1B). The etch stop layer 314 may be formed by any suitable process, such as CVD, PECVD, ALD, PEALD, or any suitable process. In some embodiments, the etch stop layer 314 is a conformal layer formed by ALD. In some embodiments, the etch stop layer 314 may include two or more layers. For example, the etch stop layer 314 may be a single layer or a bilayer structure including SiN, SiCN, SiCON, SiCO, or other suitable materials. In some embodiments, the etch stop layer 314 includes aluminum nitride (AlN), aluminum oxide (AlO), or AlN and AlOx bilayer structure. The etch stop layer 314 may have a thickness ranging from about 3 nm to about 10 nm.

Another dielectric layer 316 is disposed on the etch stop layer 314. The dielectric layer 316 may include the same material as the dielectric layer 310 and may be formed by the same process as the dielectric layer 310.

As shown in FIG. 3B, a conductive feature 318 is disposed in the dielectric layer 316 and the etch stop layer 314. The conductive feature 318 may include the same material as the conductive feature 312 and may be formed by the same process as the conductive feature 312. In some embodiments, the conductive feature 318 is a conductive feature 304 shown in FIG. 2. In some embodiments, an opening is first formed in the dielectric layer 316 and the etch stop layer 314, and the conductive feature 318 is then formed in the opening. In some embodiments, the conductive feature 318 includes a barrier layer (not shown) disposed between the dielectric layer 316 and the electrically conductive material of the conductive feature 318. As shown in FIG. 3B, the conductive feature 318 is electrically connected to the conductive feature 312. After forming the conductive feature 318 in the opening of the dielectric layer 316 and the etch stop layer 314, a planarization process may be performed, so the top surface of the conductive feature 318 and the top surface of the dielectric layer 316 may be substantially co-planar. The planarization process may be any suitable process, such as a chemical-mechanical polishing (CMP) process.

Figure 3C:
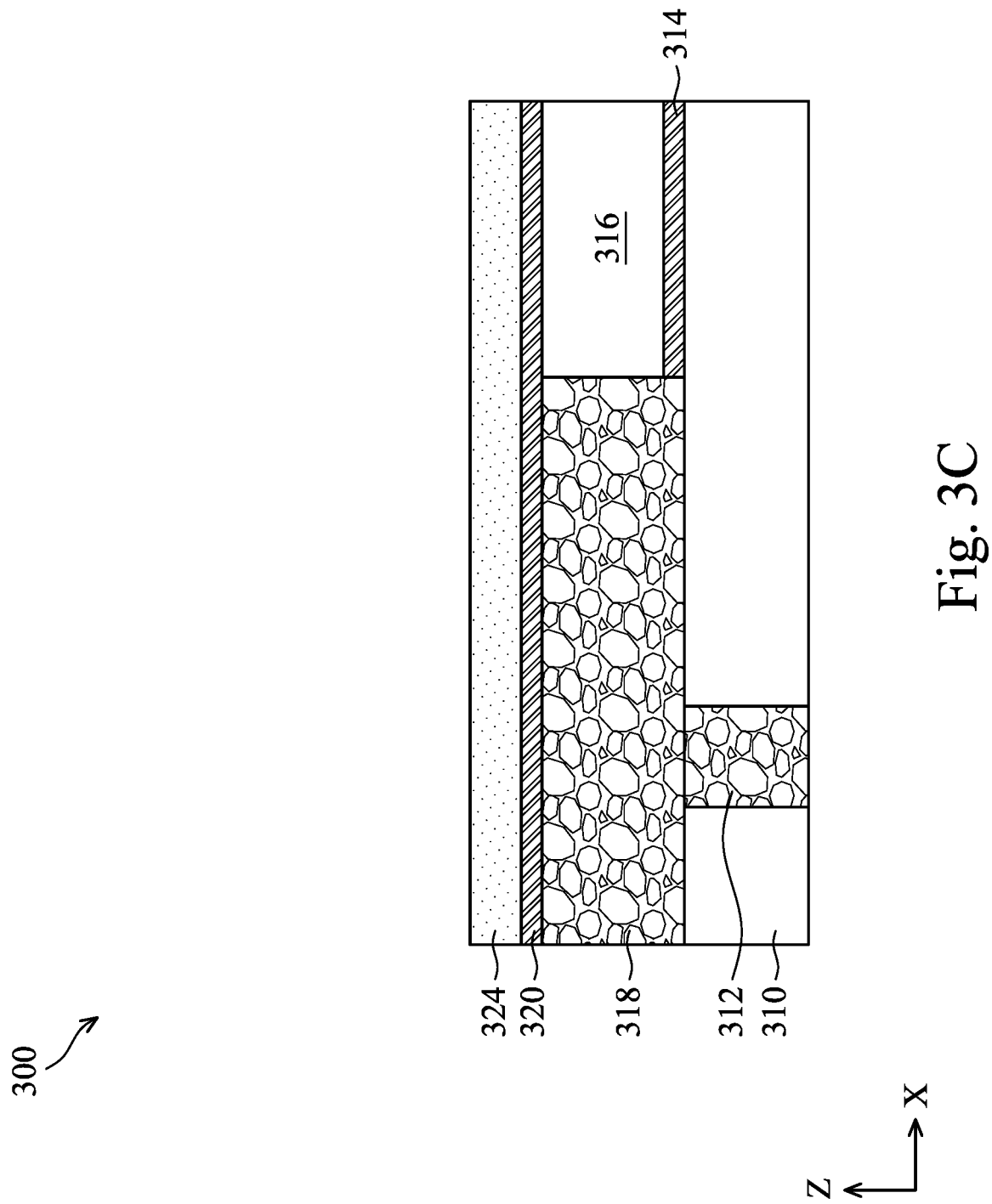

As shown in FIG. 3C, an etch stop layer 320 is disposed on the conductive feature 318 and the dielectric layer 316. The etch stop layer 320 may include the same material as the etch stop layer 314 and may be formed by the same process as the etch stop layer 314. In some embodiments, the etch stop layer 320 includes AlN and AlO bilayer structure, and the AlN layer of the bilayer structure may be formed by PEALD using trimethylaluminum (TMA) and $NH_3$ as precursors. The AlN layer may have a thickness of at least 1 nm in order to prevent the conductive feature 318 from being oxidized. The AlO layer of the bilayer structure may be formed by a thermal ALD process using the TMA precursor and an oxygen-containing precursor. The oxygen-containing precursor may be $H_2O$ or $O_3$, and the temperature of the thermal ALD process may be less than about 350 degrees Celsius. In some embodiments, the etch stop layer 320 includes SiCN having about 8 to about 20 atomic percent carbon and about 40 to about 55 atomic percent nitrogen.

The heat dissipation layer 324 is disposed on the etch stop layer 320. In some embodiments, the substrate 102 is a semiconductor wafer, such as a 300 mm wafer, and the heat dissipation layer 324 is disposed over the entire substrate 102. In some embodiments, the heat dissipation layer 324 is disposed over a portion of the substrate 102, such over one or more regions of the substrate 102 that subsequently diced into dies. For example, the heat dissipation layer 324 may be disposed over one or more dies. In some embodiments, the heat dissipation layer 324 is disposed over regions with low via density, such as less than about 4 percent. The heat dissipation layer 324 includes a material having high thermal conductivity, such as 80 to 1500 times the thermal conductivity of the dielectric layer 316. In some embodiments, the dielectric layer 316 includes a low-k dielectric material, such as SiOCH, and the thermal conductivity of the low-k dielectric material is about 0.25 W/m-K. The heat dissipation layer 324 may include a material having thermal conductivity ranging from about 20 W/m-K to about 400 W/m-K. For example, the heat dissipation layer 324 includes AlO, AlN, Ru, W, Cu, Al, Ag, or other suitable material. The heat dissipation layer 324 may be formed by any suitable process, such as CVD, PECVD, ALD, PVD, ECP, or any suitable process.

In some embodiments, the heat dissipation layer 324 includes Ru, W, Al, or Ag and has a thickness less than about 10 nm, such as from about 3 nm to about 8 nm. Compared to other materials having high thermal conductivity, Ru, W, Al or Ag has relatively higher thermal conductivity, such as from about 100 W/m-K to about 450 W/m-K, with the thickness ranging from about 3 nm to about 8 nm. If the thickness of the heat dissipation layer 324 is less than about 3 nm, the heat dissipation layer 324 may not be sufficient to dissipate heat generated by the conductive features, such as the conductive features 312, 318, disposed in the interconnect structure 300. On the other hand, if the thickness of the heat dissipation layer 324 is greater than about 8 nm, the heat dissipation layer 324 may be too close to a conductive feature disposed thereabove, leading to increased parasitic capacitance. In some embodiments, the heat dissipation layer 324 includes Ru and is formed by a thermal CVD process.

Figure 3D:
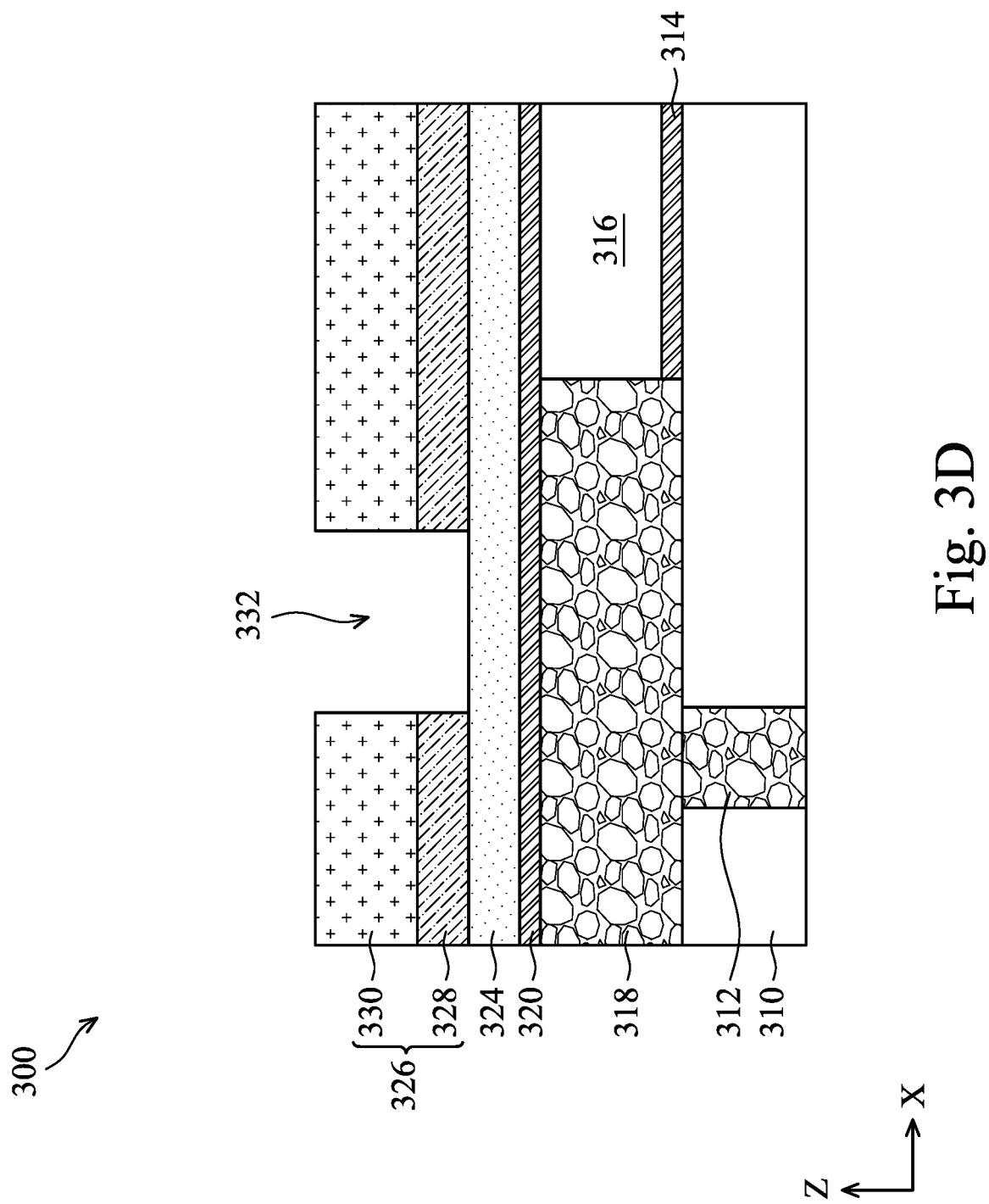

As shown in FIG. 3D, a multilayer structure 326 is disposed on the heat dissipation layer 324. The multilayer structure 326 includes a hard mask layer 328 and a photoresist layer 330 disposed on the hard mask layer 328. In some embodiments, the hard mask layer 328 may be a dielectric material including silicon, a metal oxide, or a metal nitride. The hard mask layer 328 may be formed by any suitable process, such as CVD, PECVD, ALD, or PEALD. In some embodiments, the hard mask layer 328 includes SiCN having about 8 to about 20 atomic percent carbon and about 40 to about 55 atomic percent nitrogen. In some embodiments, the hard mask layer 328 includes the same material as the etch stop layer 320. For example, the hard mask layer 328 may include SiCN or AlN and AlO bilayer structure. The etch selectivity of the hard mask layer 328 to the heat dissipation layer 324 may be greater than about 1.5. The photoresist layer 330 may be a chemically amplified photoresist layer and can be a positive tone photoresist or a negative tone photoresist. The photoresist layer 330 may include a polymer, such as phenol formaldehyde resin, a poly(norbornene)-co-malaic anhydride (COMA) polymer, a poly(4-hydroxystyrene) (PHS) polymer, a phenol-formaldehyde (hakelite) polymer, a polyethylene (PE) polymer, a polypropylene (PP) polymer, a polycarbonate polymer, a polyester polymer, or an acrylate-based polymer, such as a poly (methyl methacrylate) (PMMA) polymer or poly (methacrylic acid) (PMAA). The photoresist layer 330 may be formed by spin-on coating.

As shown in FIG. 3D, the photoresist layer 330 is patterned. The patterning of the photoresist layer 330 may include exposing the photoresist layer 330 to an exposure light/beam through a photo mask (not shown). The exposure light/beam can be deep ultraviolet (DUV) light, such as KrF excimer laser light and ArF excimer laser light having a wavelength around 193 nm or 248 nm. In some embodiments, multiple exposure processes are performed. After the exposure process, a developing process is performed to form the patterned photoresist layer 330. As a result of the patterning process, one or more openings 332 are formed in the photoresist layer 33 to expose one or more portions of the hard mask layer 328. Next, the exposed portions of the hard mask layer 328 are removed by any suitable process, such as a dry etch, wet etch, or a combination thereof. In some embodiments, a plasma dry etch using $CH_xF_y$ or $CF_x$ and $N_2$ gases is performed to remove the exposed portions of the hard mask layer 328. Oxygen-containing etchant may not be used to remove the portions of the hard mask layer 328 in order to prevent oxidation of the heat dissipation layer 324. In some embodiments, a wet etch process using ammonium hydroxide is performed to remove the portions of the hard mask layer 328. The removal of the one or more portions of the hard mask layer 328 exposes one or more portions of the heat dissipation layer 324, as shown in FIG. 3D. In other words, the one or more openings 332 extends to expose one or more portions of the heat dissipation layer 324. In some embodiments, the etch selectivity of the hard mask layer 328 to the heat dissipation layer 324 in the dry etch or wet etch process performed to remove the exposed one or more portions of the mask layer 328 may be greater than about 2.5.

Figure 3E:
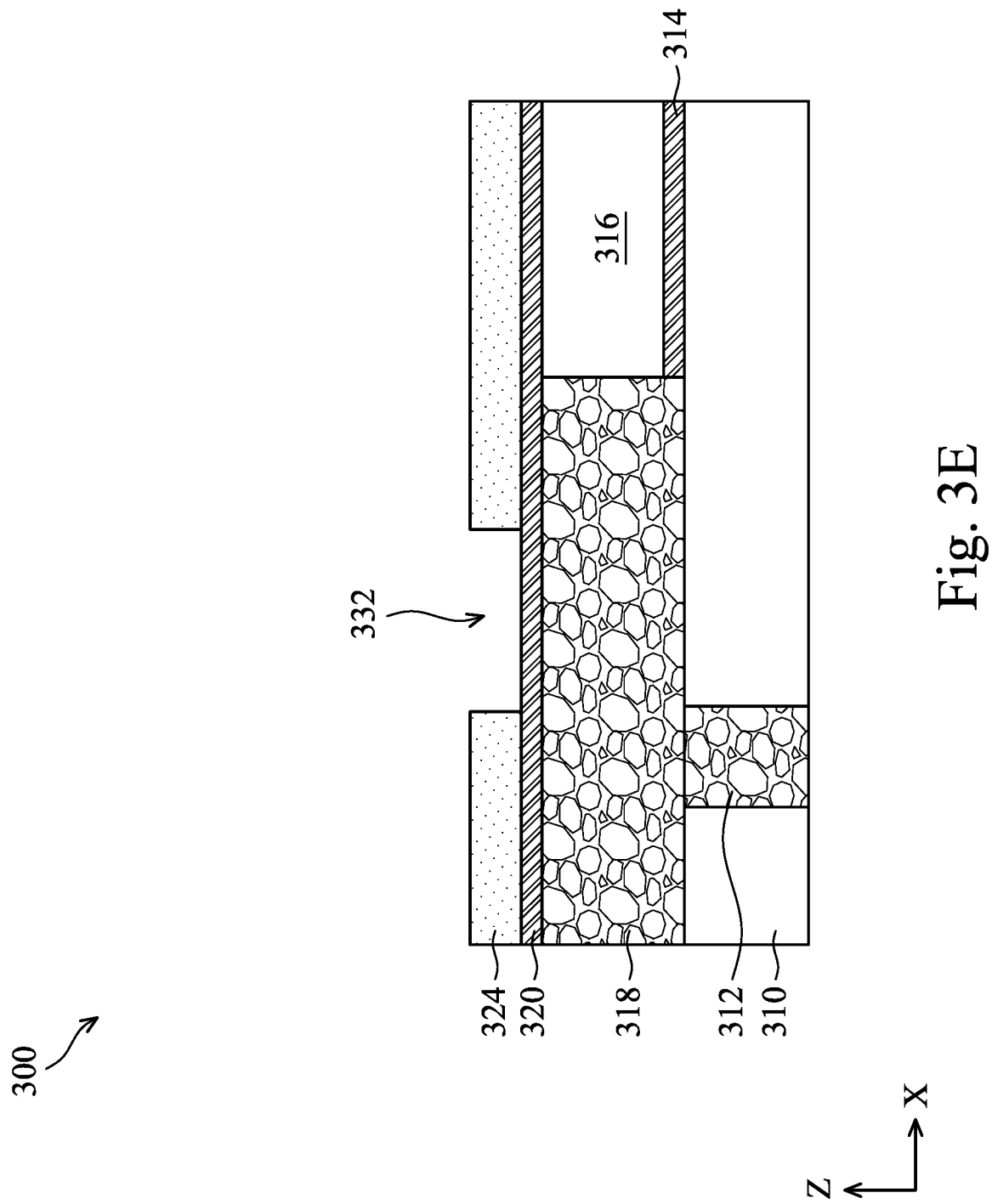

As shown in FIG. 3E, the exposed one or more portions of the heat dissipation layer 324 are removed to expose one or more portions of the etch stop layer 320. In other words, the openings 332 may be extend to the heat dissipation layer 324. The exposed one or more portions of the heat dissipation layer 324 may be removed by any suitable process, such as a dry etch, a wet etch, or a combination thereof. In some embodiments, a thermal dry etch using CO gas is performed to remove the exposed one or more portions of the heat dissipation layer 324. For example, in the embodiment that the heat dissipation layer 324 includes Ru, the CO gas reacts with the Ru to form $Ru_3(CO)_{12}$. In some embodiments, a wet etch using ceric ammonium nitrate based aqueous solution is used to remove the exposed one or more portions of the heat dissipation layer 324. In some embodiments, the heat dissipation layer 324 includes W, and $H_2O_2$ based solution is used to remove the exposed one or more portions of the heat dissipation layer 324. In some embodiments, the etch selectivity of the heat dissipation layer 324 to the etch stop layer 320 in the dry etch or wet etch process performed to remove the exposed one or more portions of the heat dissipation layer 324 may be greater than about 1.5. The remaining photoresist layer 330 and the hard mask layer 328 may be removed after extending the opening 332 in the heat dissipation layer 324. The remaining photoresist layer 330 may be removed by an ash process, and the remaining hard mask layer 328 may be removed by a plasma dry etch process.

Figure 3F:
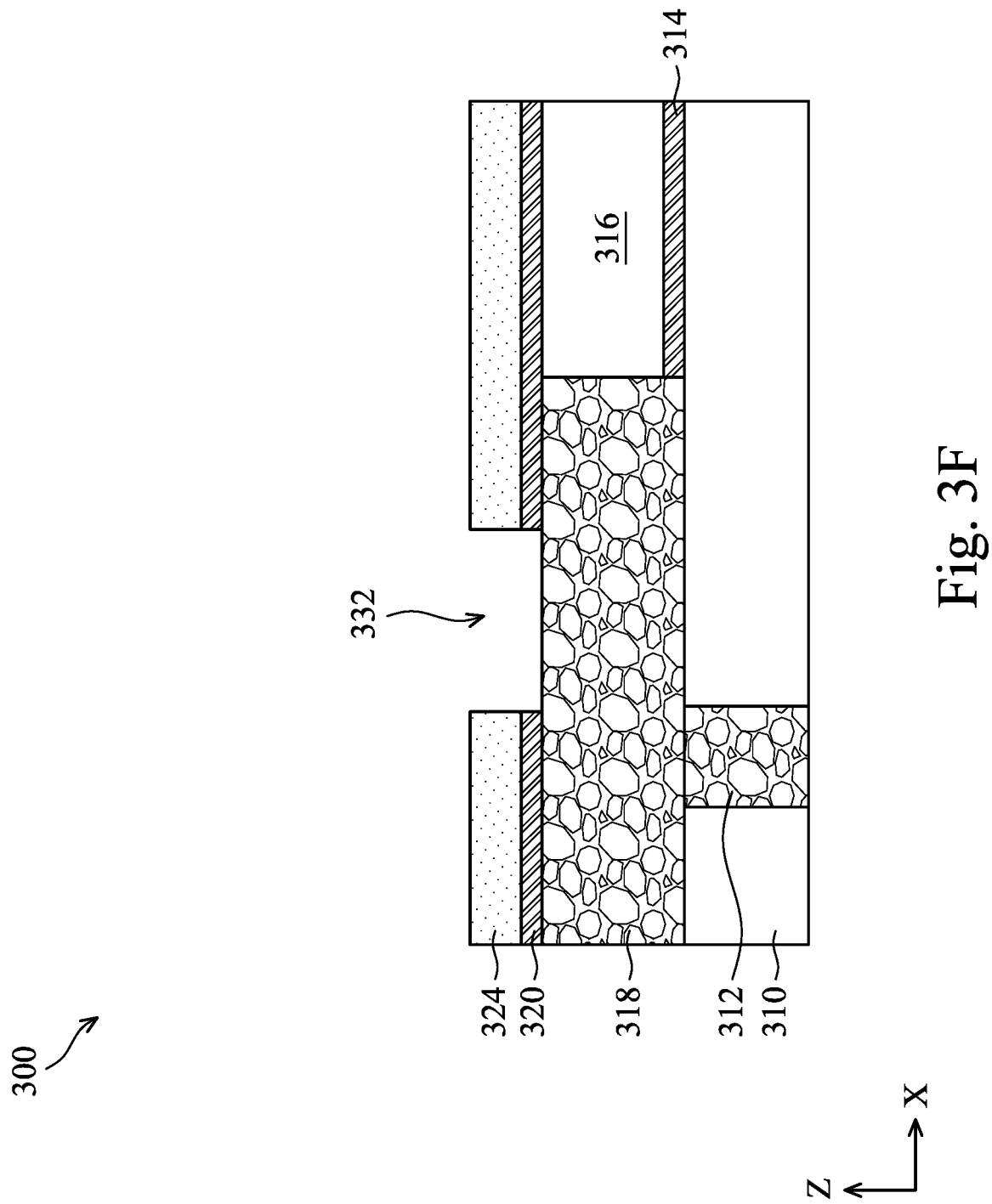

As shown in FIG. 3F, the exposed one or more portions of the etch stop layer 320 are removed to expose one or more portions of the conductive feature 318. In other words, the openings 332 may be extend to the etch stop layer 320. The exposed one or more portions of the etch stop layer 320 may be removed by any suitable process, such as a dry etch, a wet etch, or a combination thereof. In some embodiments, a selective wet etch using ammonium hydroxide based aqueous solution is used to remove the exposed one or more portions of the etch stop layer 320. In some embodiments, a plasma dry etch using $CH_xF_y$ or $CF_x$ and $N_2$ gases is performed to remove the exposed portions of the etch stop layer 320.

Figure 3G:
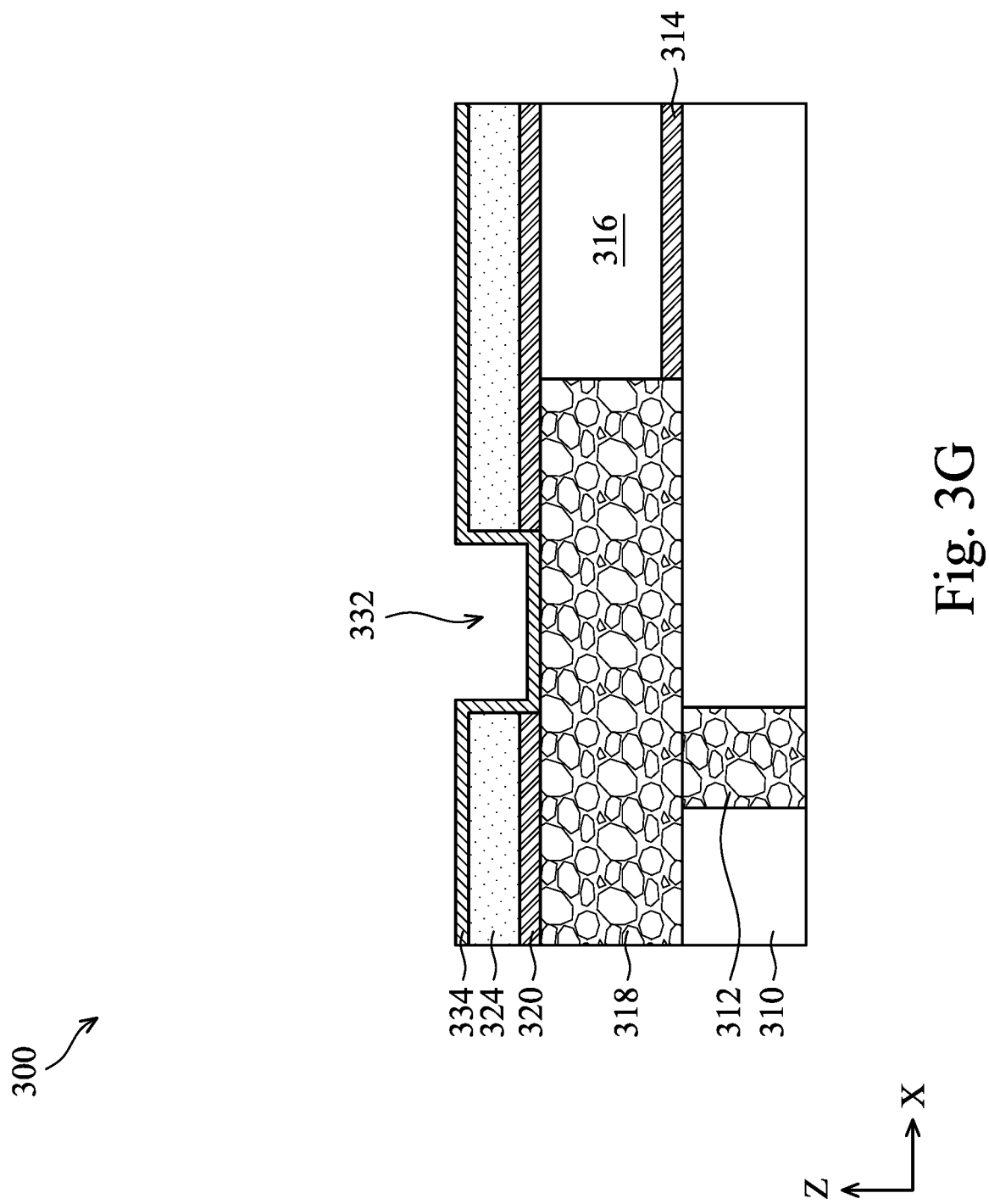

As shown in FIG. 3G, an etch stop layer 334 is disposed on the heat dissipation layer 324 and in the openings 332 covering side surfaces of the heat dissipation layer 324 and the etch stop layer 320. The etch stop layer 334 may include the same or different material as the etch stop layer 320 and may be formed by the same process as the etch stop layer 320. In some embodiments, the etch stop layers 320, 334 both includes AlN and AlO bilayer structure, and the heat dissipation layer 324 includes Ru. The AlN layer may have a thickness of at least 1 nm in order to prevent the heat dissipation layer 324 from being oxidized. In some embodiments, the etch stop layer 320 includes SiCN, the etch stop layer 334 includes AlN and AlO bilayer structure, and the heat dissipation layer 324 includes W.

Figure 3H:
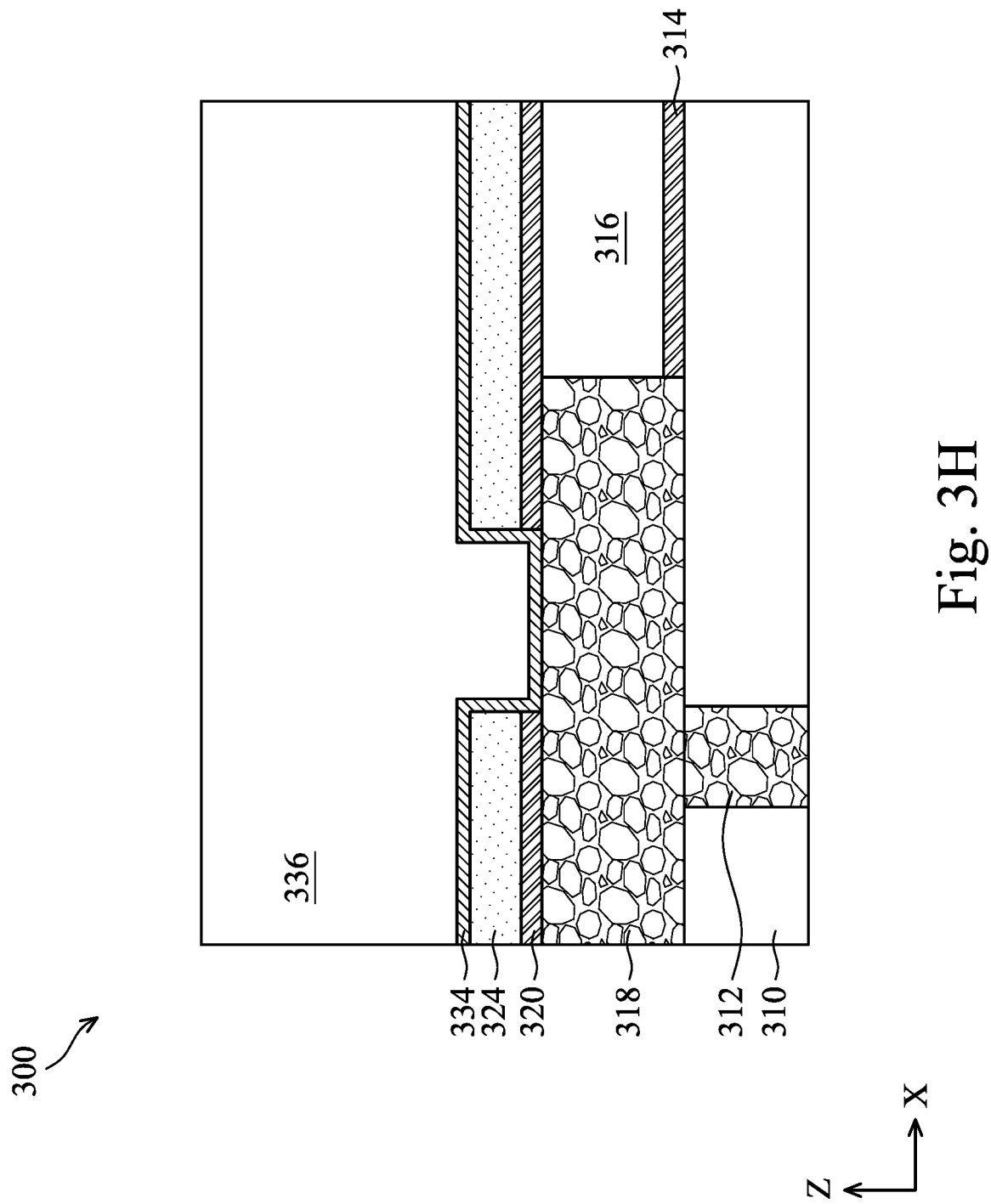

As shown in FIG. 3H, a dielectric layer 336 is disposed on the etch stop layer 334 and fills the openings 332. The dielectric layer 336 may include the same material as the dielectric layer 316 and may be formed by the same process as the dielectric layer 316. In some embodiments, the dielectric layer 336 includes a low-k dielectric material, such as SiOCH formed by FCVD. The FCVD process may include using two silicon-containing precursors and remote plasma with oxygen-containing reactant gas and helium carrier gas. In some embodiments, a post thermal curing or UV curing is performed after the FCVD process, and the curing temperature ranges from about 250 degrees Celsius to about 400 degrees Celsius in order for film densification.

Figure 3I:
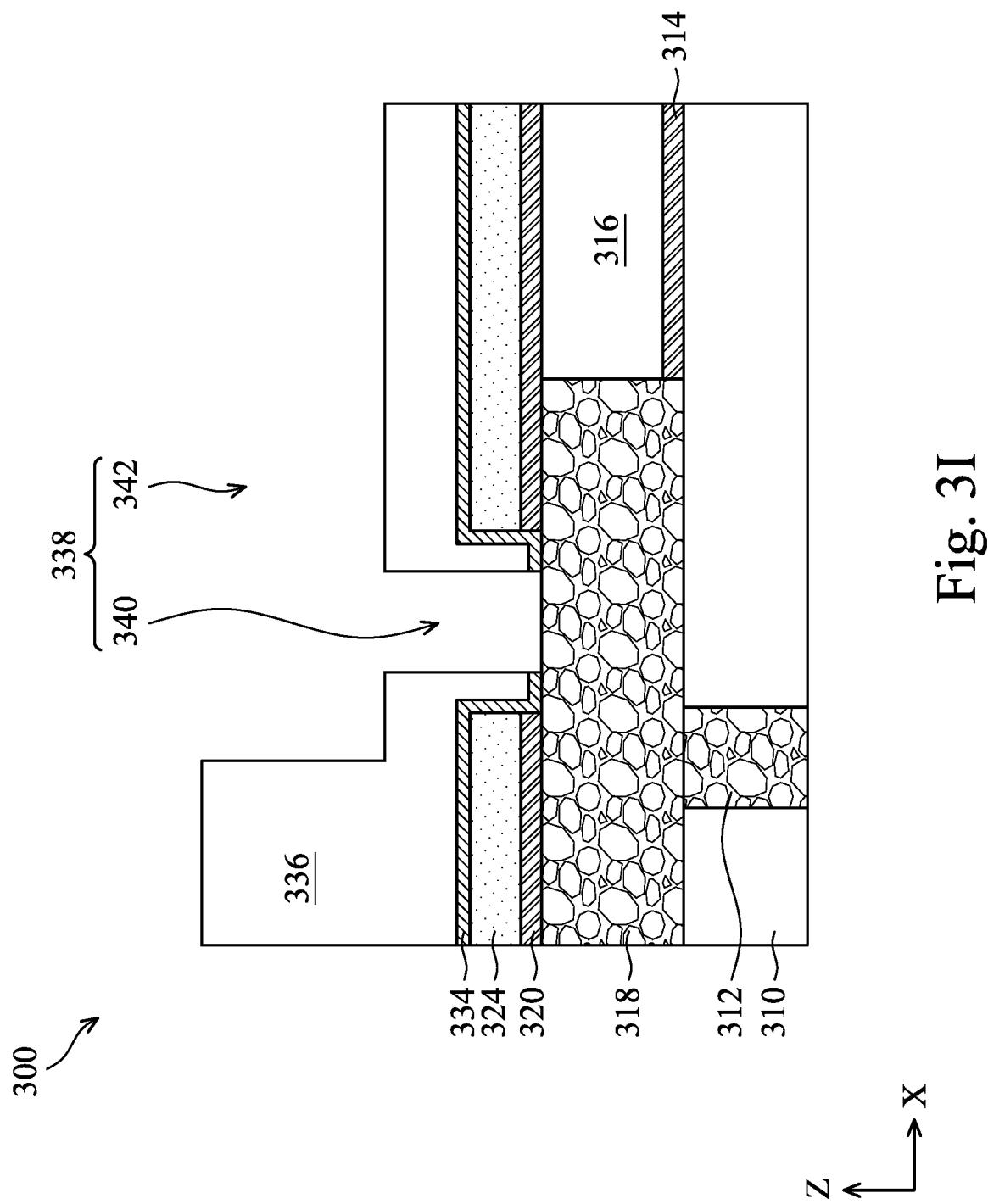
Figure 3J:
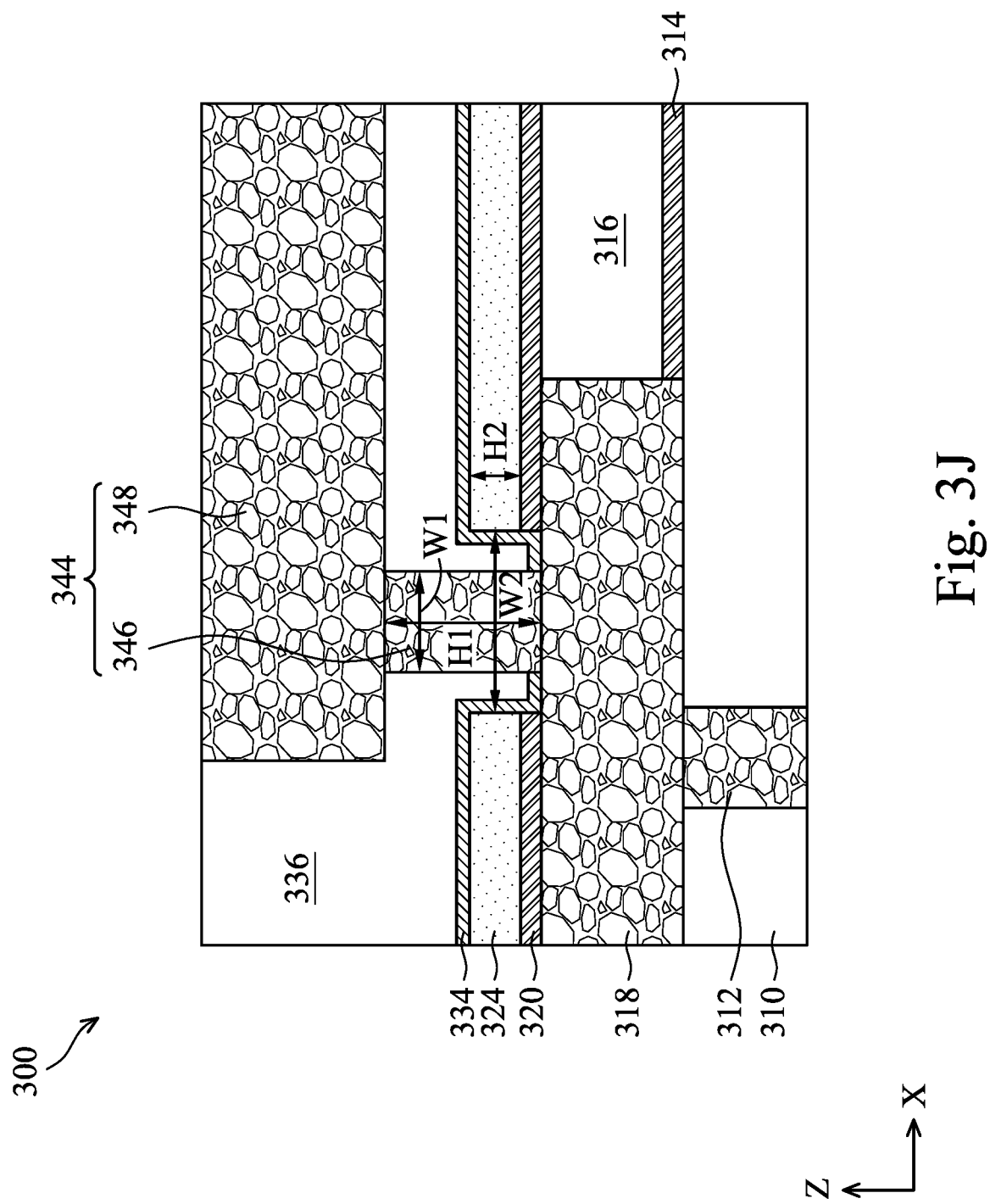

As shown in FIG. 3I, one or more openings 338 (only one is shown) is formed in the dielectric layer 336 and the etch stop layer 334. The opening 338 may include a bottom portion 340 and a top portion 342. In some embodiments, the bottom portion 340 is a via opening and the top portion 342 is a trench. As shown in FIG. 3J, a conductive material 344 is formed in the opening 338. The conductive material 344 may include the same material as the conductive feature 318. The conductive material 344 may include a bottom portion 346 and a top portion 348. The bottom portion 346 may be formed in the bottom portion 340 of the opening 338, and the top portion 348 may be formed in the top portion 342 of the opening 338. In some embodiments, the bottom portion 346 is a conductive via and the top portion 348 is a conductive line. For example, the bottom portion 346 may be the conductive feature 306 shown in FIG. 2, and the top portion 348 may be the conductive feature 304 shown in FIG. 2.

In order to prevent the bottom portion 346 of the conductive material 344 from contacting the heat dissipation layer 324, the width W1 of the bottom portion 346 may be substantially less than the width W2 of the opening in the heat dissipation layer 324. In some embodiments, the width W2 is about 50 percent to about 500 percent larger than the width W1. In some embodiments, the bottom portion 346 is cylindrical, and the width W1 is a diameter. The width W1 may correspond to the width of the bottom portion 340 of the opening 338 (FIG. 3I), and the width W2 may correspond to the width of the opening 332 (FIG. 3F). In order to prevent the top portion 348 of the conductive material 344 from contacting the heat dissipation layer 324, the height H1 of the bottom portion 346 may be substantially greater than the height H2 of the heat dissipation layer 324. In some embodiments, the height H2 is about 20 percent to about 50 percent of the height H1.

During operation, the conductive features 312, 318 and the conductive material 344 conduct electrical current, and heat is generated in these materials. As device dimensions getting smaller, poor vertical heat dissipation through vias can limit the via density and via size. The heat dissipation layer 324 helps to dissipate heat, such as providing horizontal heat dissipation. The etch stop layer 320 disposed between the heat dissipation layer 324 and the dielectric layer 316 also has higher thermal conductivity than the dielectric layer 316. With improved heat dissipation, device performance is also improved. The heat dissipation layer 324 is electrically isolated from the conductive features 312, 318 and the conductive material 344.

Figure 3K:
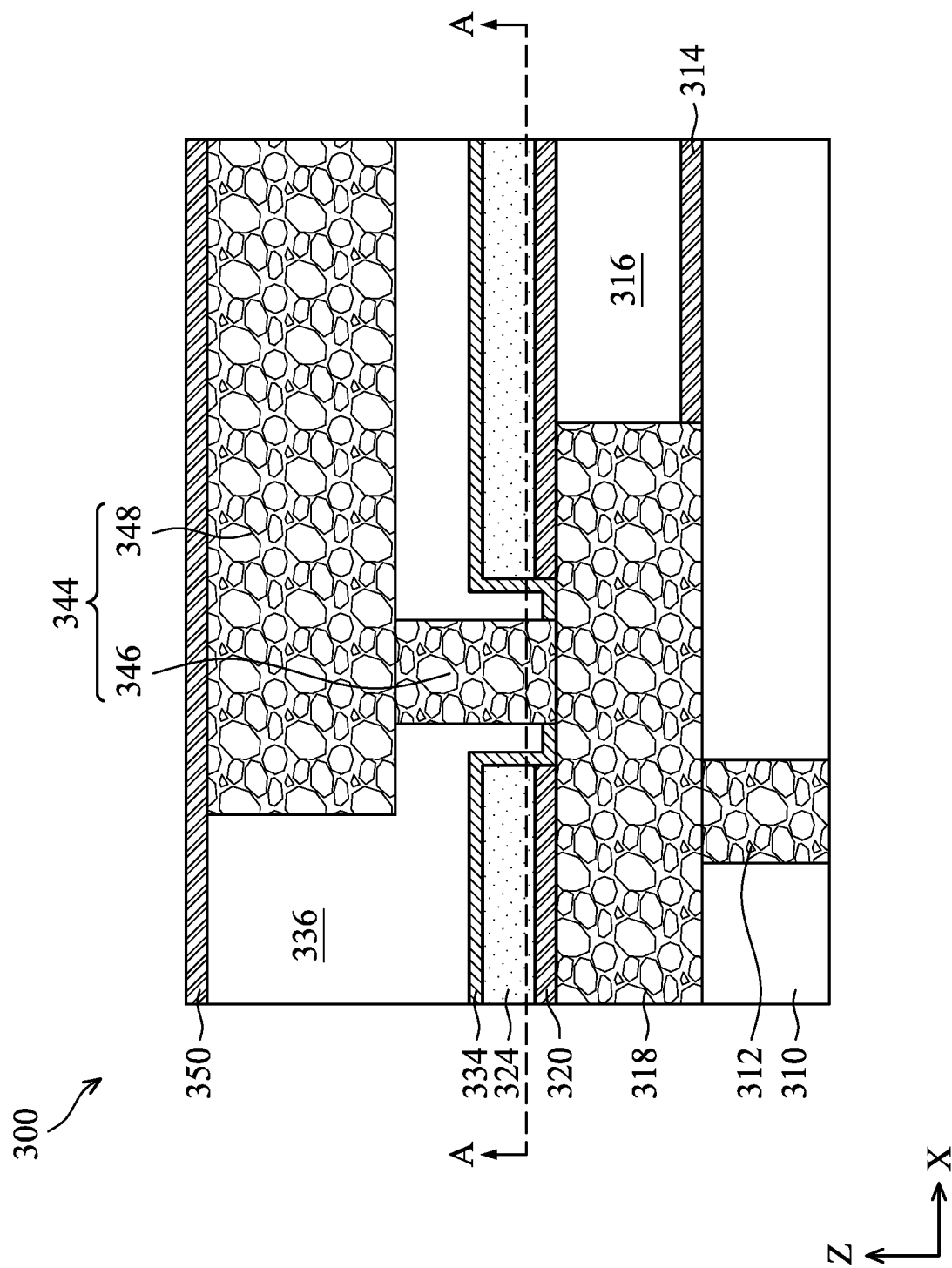

As shown in FIG. 3K, an etch stop layer 350 is disposed on the dielectric layer 336 and the conductive material 344. The etch stop layer 350 may include the same material as the etch stop layer 320 and formed by the same process as the etch stop layer 320. Additional IMD layers and conductive features may be formed on the etch stop layer 350 to complete the interconnect structure 300. In some embodiments, the dielectric layers 310, 316, 336 and the dielectric layers to be formed over the etch stop layer 350 may be the IMD layers 302 shown in FIG. 2.

Figure 4A:
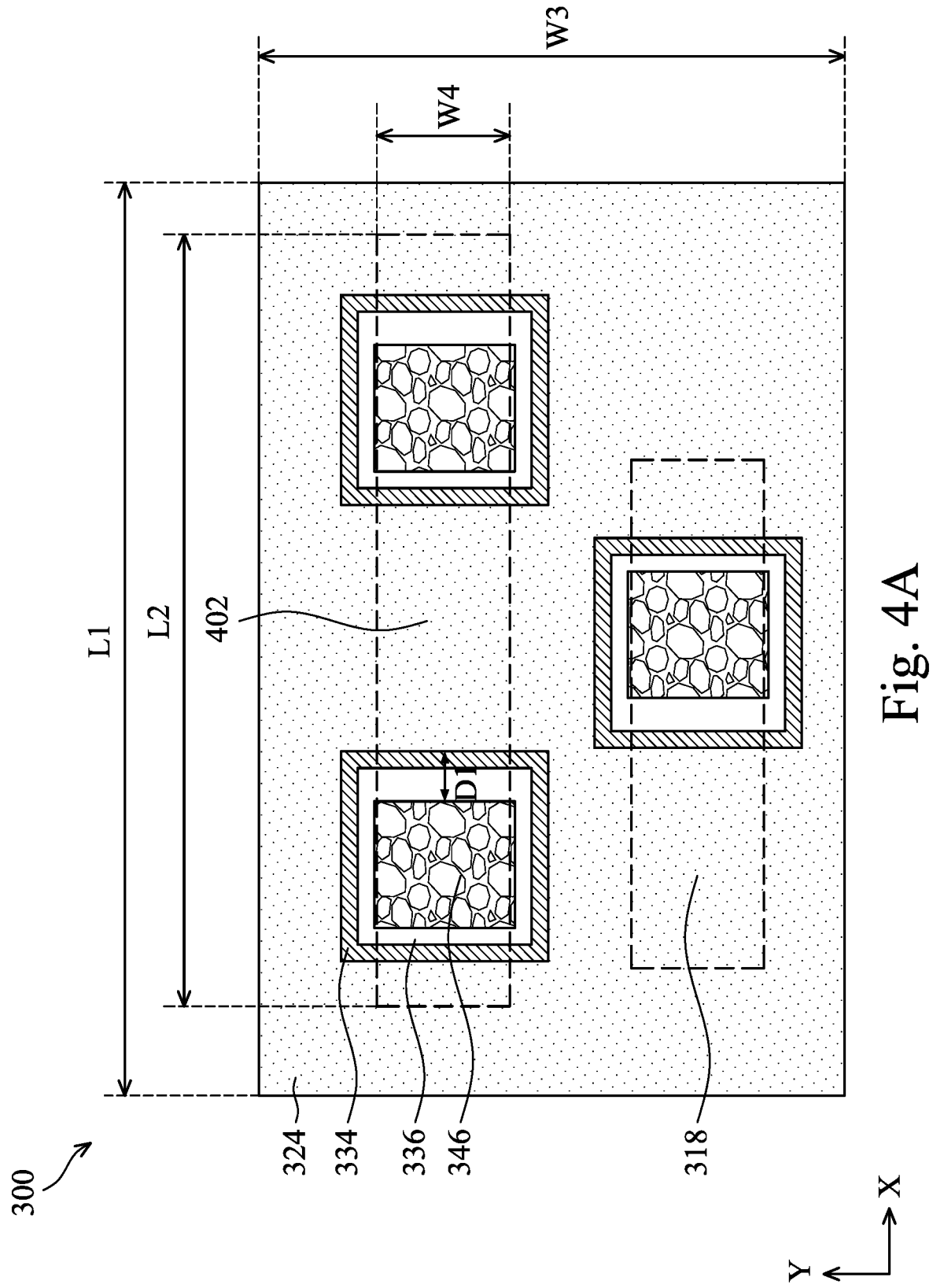
FIGS. 4A and 4B are cross-sectional top views of the interconnect structure along cross-section A-A shown in FIG. 3K, in accordance with some embodiments.
Figure 4B:
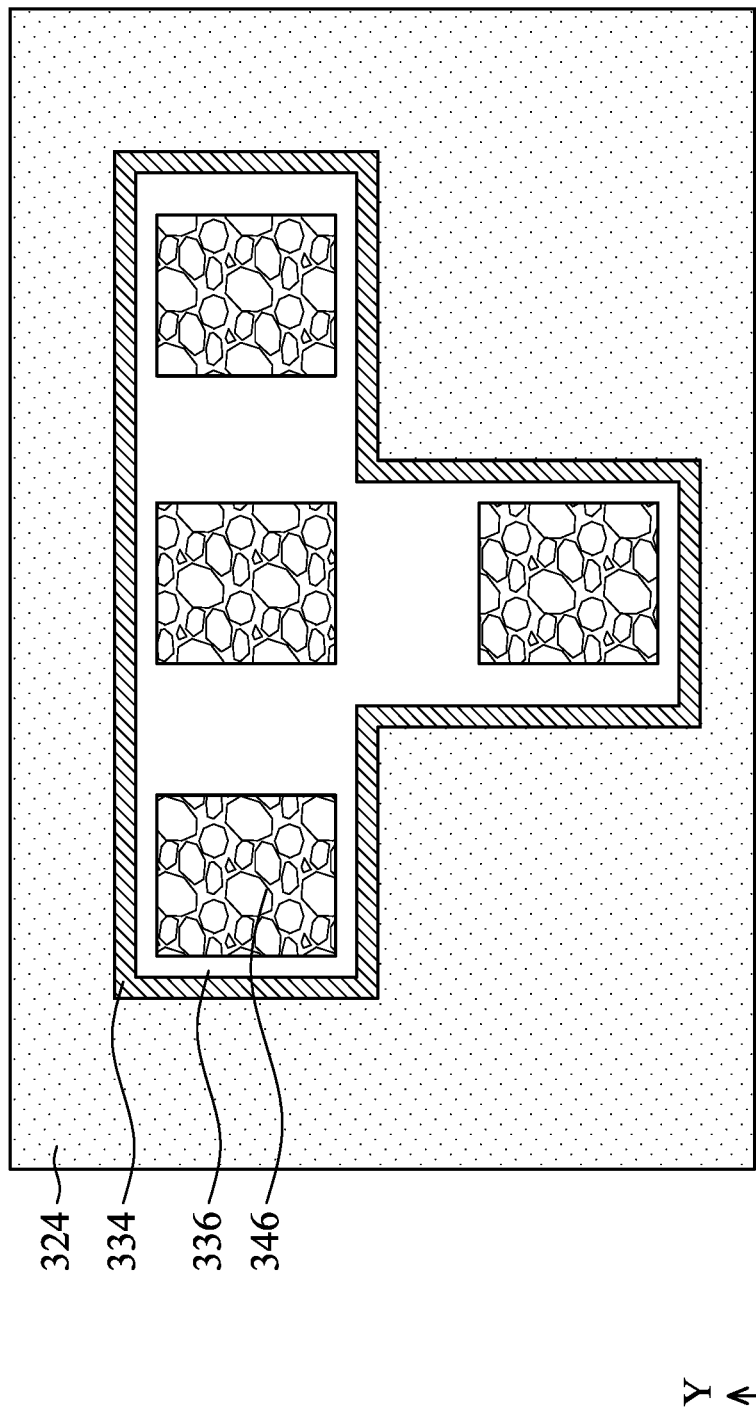

FIGS. 4A and 4B are cross-sectional top views of the interconnect structure 300 along cross-section A-A shown in FIG. 3K, in accordance with some embodiments. As shown in FIG. 4A, in some regions over the substrate 102, the bottom portions 346 of the conductive material 344, or conductive vias, are partially surrounded by the heat dissipation layer 324. The heat dissipation layer 324 partially surrounds each bottom portions 346 because the height of the heat dissipation layer 324 is substantially less than the height of the bottom portion 346. Because the width W1 of the bottom portion 346 is substantially less than the width W2 of the opening (filled with the etch stop layer 334 and the dielectric layer 336) in the heat dissipation layer 324, the bottom portion 346 is at least a distance D1 away from the heat dissipation layer 324. In some embodiments, the distance D1 is at least 6 nm.

As shown in FIG. 4A, a major surface of the heat dissipation layer 324 is substantially larger than the that of the conductive feature 318 and a conductive feature 402 disposed under the bottom portions 346. In other words, the dimensions of the heat dissipation layer 324 is the X-Y plane is substantially greater than those of the conductive features 318, 402. As a result, horizontal heat dissipation can be achieved by the heat dissipation layer 324. In some embodiments, the area of the major surface of the heat dissipation layer 324 is about 2 to 100 times larger than the area of a major surface of the conductive feature 318, 402. In some embodiments, the heat dissipation layer 324 has a length L1 along the x-axis and a width W3 along the y-axis. The conductive feature 402 has a length L2 along the x-axis and a width W4 along the y-axis. The length L1 is about 1 to about 10 times greater than the length L2, and the width W3 is about 1 to about 10 times greater than the width W4. The substantially larger heat dissipation layer 324 helps disperse heat in the interconnect structure 300 to reduce localized heating. In some embodiments, as shown in FIG. 4B, a group of bottom portions 346 of the conductive material 344 is partially surrounded by the heat dissipation layer 324.

The present disclosure in various embodiments provides an interconnect structure and methods for forming the same. In some embodiments, the interconnect structure 300 includes a heat dissipation layer disposed over a conductive feature and partially surrounding a conductive via. The heat dissipation layer may be disposed between two etch stop layers. Some embodiments may achieve advantages. For example, the heat dissipation layer 324 helps to dissipate heat, such as providing horizontal heat dissipation. The bottom etch stop layer 320 also has a higher thermal conductivity than the dielectric layer 316. With improved heat dissipation, device performance is also improved.

An embodiment is an interconnect structure. The structure includes a first dielectric layer disposed over one or more devices, a first conductive feature disposed in the first dielectric layer, a second dielectric layer disposed over the first dielectric layer and the first conductive feature, and a second conductive feature disposed in the second dielectric layer. The second conductive feature is electrically connected to the first conductive feature. The structure further includes a heat dissipation layer disposed between the first and second dielectric layers, and the heat dissipation layer partially surrounds the second conductive feature and is electrically isolated from the first and second conductive features.

Another embodiment is an interconnect structure. The structure includes a first dielectric layer disposed over one or more devices, a first conductive feature disposed in the first dielectric layer, a first etch stop layer disposed on the first conductive feature and the first dielectric layer, a heat dissipation layer disposed on the first etch stop layer, a second etch stop layer disposed on the heat dissipation layer, a second dielectric layer disposed on the second etch stop layer, and a second conductive feature disposed in the second dielectric layer. The second conductive feature is electrically connected to the first conductive feature, and the heat dissipation layer is electrically isolated from the first and second conductive features.

A further embodiment is a method. The method includes forming a first dielectric layer, forming a first conductive feature in the first dielectric layer, forming a heat dissipation layer over the first dielectric layer and the first conductive feature, forming a first opening in the heat dissipation layer, forming a second dielectric layer in the first opening, and forming a second conductive feature in the second dielectric layer. The second conductive feature is electrically connected to the first conductive feature, and the heat dissipation layer is electrically isolated from the first and second conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a first dielectric layer;
   forming a first conductive feature in the first dielectric layer;
   forming a heat dissipation layer over the first dielectric layer and the first conductive feature;
   forming a first opening in the heat dissipation layer;
   forming a second dielectric layer in the first opening; and
   forming a second conductive feature in the second dielectric layer, wherein the second conductive feature is electrically connected to the first conductive feature, and the heat dissipation layer is electrically isolated from the first and second conductive features.

2. The method of claim 1, further comprising forming a first etch stop layer on the first dielectric layer and the first conductive feature, wherein the heat dissipation layer is formed on the first etch stop layer.

3. The method of claim 2, further comprising extending the first opening in the first etch stop layer before forming the second dielectric layer.

4. The method of claim 3, further comprising forming a second etch stop layer on the heat dissipation layer and in the first opening in the heat dissipation layer, wherein the second dielectric layer is formed on the second etch stop layer.

5. The method of claim 4, further comprising forming a second opening in the second dielectric layer and the second etch stop layer.

6. The method of claim 5, wherein the second conductive feature is formed in the second opening.

7. A method, comprising:
   forming a first conductive feature over a substrate;
   forming a heat dissipation layer over the first conductive feature, wherein a major surface of the heat dissipation layer is substantially greater than a major surface of the first conductive feature;
   forming a first opening in the heat dissipation layer; and
   forming two or more second conductive features in the first opening, wherein at least one of the two or more second conductive features is electrically connected to the first conductive feature, and the heat dissipation layer is electrically isolated from the first and second conductive features.

8. The method of claim 7, further comprising forming a first etch stop layer on the first conductive feature, wherein the heat dissipation layer is formed on the first etch stop layer.

9. The method of claim 8, wherein the first opening is formed in the first etch stop layer, and a first portion of the first conductive feature is exposed.

10. The method of claim 9, further comprising forming a second etch stop layer in the first opening and on the exposed first portion of the first conductive feature.

11. The method of claim 10, further comprising forming a dielectric layer on the second etch stop layer in the first opening.

12. The method of claim 11, further comprising forming two or more second openings in the dielectric layer and the second etch stop layer, wherein the two or more second conductive features are formed in the corresponding two or more second openings.

13. The method of claim 11, wherein side surfaces of the two or more conductive features are surrounded by the dielectric layer.

14. The method of claim 7, wherein the two or more conductive features are conductive vias.

15. A method, comprising:
   forming a first conductive feature over a substrate;
   depositing a first etch stop layer on the first conductive feature;
   depositing a heat dissipation layer on the first etch stop layer;

forming a first opening in the heat dissipation layer and the first etch stop layer to expose a first portion of the first conductive feature;

depositing a dielectric layer in the first opening and over the heat dissipation layer;

forming a second opening in the dielectric layer to expose a second portion of the first conductive feature, wherein the second portion is substantially smaller than the first portion of the first conductive feature; and forming a second conductive feature in the second opening, wherein the second conductive feature is electrically connected to the first conductive feature, and the heat dissipation layer is electrically isolated from the first and second conductive features.

16. The method of claim 15, wherein the heat dissipation layer is formed over the entire substrate.

17. The method of claim 15, further comprising depositing a second etch stop layer in the first opening, wherein the dielectric layer is deposited on the second etch stop layer.

18. The method of claim 17, wherein the second etch stop layer is in contact with the first etch stop layer.

19. The method of claim 17, wherein the second etch stop layer is in contact with a side surface and a top surface of the heat dissipation layer.

20. The method of claim 15, wherein the second conductive feature comprises a top portion and a bottom portion, wherein the bottom portion is disposed in the second opening, and the top portion is disposed in the dielectric layer.

* * * * *